United States Patent [19]

Murai et al.

[11] Patent Number: 5,779,790
[45] Date of Patent: Jul. 14, 1998

[54] METHOD OF MANUFACTURING A SILICON MONOCRYSTAL

[75] Inventors: Toshinari Murai; Naoki Nagai, both of Annaka, Japan

[73] Assignee: Shin-Etsu Handotai Co., Ltd., Tokyo, Japan

[21] Appl. No.: 814,107

[22] Filed: Mar. 10, 1997

[30] Foreign Application Priority Data

Mar. 15, 1996 [JP] Japan .................. 8-087187

[51] Int. Cl.⁶ .................................. C30B 15/20
[52] U.S. Cl. .................. 117/13; 117/15; 117/902
[58] Field of Search .................. 117/13, 15, 902

[56] References Cited

U.S. PATENT DOCUMENTS

| | | | |
|---|---|---|---|
| 3,271,118 | 9/1966 | Bhola et al. | 117/49 |
| 3,621,213 | 11/1971 | Jen et al. | 250/150 |
| 3,819,421 | 6/1974 | Menkel et al. | 148/1.6 |
| 5,248,378 | 9/1993 | Oda et al. | 117/20 |

FOREIGN PATENT DOCUMENTS

| | | |
|---|---|---|
| 0671491 | 9/1995 | European Pat. Off. |
| 1926500 | 11/1970 | Germany |
| 2149388 | 4/1973 | Germany |

OTHER PUBLICATIONS

K. M. Kim et al., "Maximum Length of Large Diameter Czochralski Silicon Single Crystals at Fracture Stress Limit of Seed", *Journal of Crystal Growth*, 100 (1990) Mar., No. 3, pp. 527–528.

*Primary Examiner*—Felisa Garrett
*Attorney, Agent, or Firm*—Oliff & Berridge, PLC

[57] ABSTRACT

In a method of manufacturing a silicon monocrystal using the Czochralski method, a seed crystal is brought into contact with silicon melt and is then pulled such that after a neck portion is formed, a silicon monocrystal is grown below the neck portion. The crystal has a hollow portion which has an opening in a contact surface of the seed crystal to be brought into contact with the silicon melt. Alternatively, the seed crystal has a hollow portion which will have an opening in the contact surface of the seed crystal when the contact surface is brought into contact with the silicon melt. Use of such seed crystals makes it possible to increase the strength of the neck portion and to pull a heavy and long silicon monocrystal having a large diameter.

12 Claims, 3 Drawing Sheets

FIG. 1A
FIG. 1B
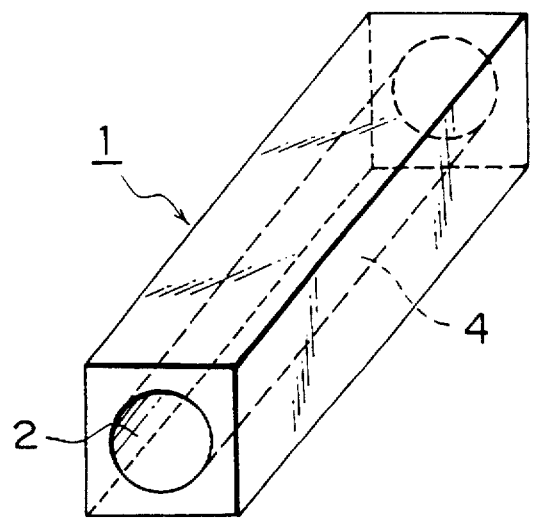
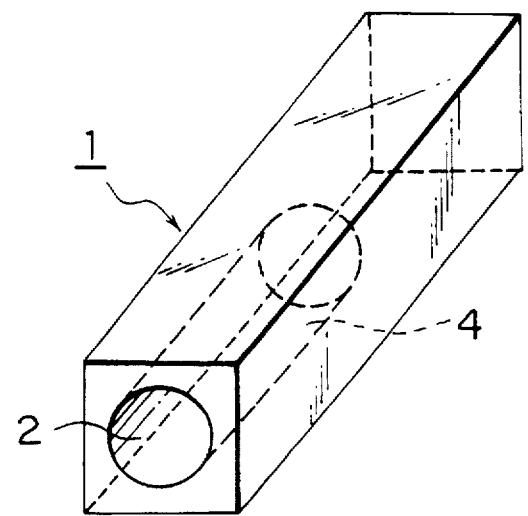

METHOD OF MANUFACTURING A SILICON MONOCRYSTAL

BACKGROUND OF THE INVENTION

1. Field of the Invention

The present invention relates to a method of manufacturing a silicon monocrystal using the Czochralski (CZ) method. Further, the present invention relates to a seed crystal for use in the manufacturing method.

2. Description of the Related Art

In the manufacture of a silicon monocrystal using the Czochralski method, monocrystalline silicon has been conventionally used as a seed crystal. The silicon monocrystal is grown by bringing the seed crystal into contact with silicon melt and pulling the seed crystal while it is rotated. At this time, operation for forming a neck portion (hereinafter referred to as "neck forming operation") is performed in order to eliminate dislocations arising in the seed crystal at a high density as a result of thermal shock when the seed crystal is brought into contact with the silicon melt. Subsequently, the diameter of the crystal is increased to a desired diameter, and the silicon monocrystal is then pulled.

In the neck forming operation, there is formed a neck portion consisting of a tapered portion for decreasing the diameter of the seed crystal and a long thin portion having a substantially cylindrical shape formed under the tapered portion.

When dislocations are eliminated from the silicon monocrystal through the neck forming operation, it is desirable to reduce the diameter of the thin portion to as small a diameter as possible. The diameter of the thin portion (i.e., the reduced diameter) is set to a diameter equal to or less than about 3 mm and a length of about 30 to 200 mm.

In recent years, there has been demand for a long silicon monocrystal having a large diameter to be used as material for semiconductor devices, in order to increase the degree of integration of the semiconductor device and to improve productivity of the same. Associated with an increase in the diameter and length of the silicon monocrystal, the weight of the silicon monocrystal to be manufactured also increases. In pulling the silicon monocrystal, all of the stresses such as a tensile stress due to the weight of the silicon monocrystal and a torsional stress due to the rotation of the silicon monocrystal act on the neck portion. Consequently, associated with an increase in the weight of the silicon monocrystal, a neck portion having an increased strength is demanded. To increase the strength of the neck portion, it is considered that the diameter of the overall neck portion—which starts from the lower edge of the seed crystal—must be increased. If the diameter of the neck portion is simply increased, the strength of the tapered portion will be increased; however, in practice, dislocations will not be eliminated from the silicon monocrystal at the thin portion. As a result, it becomes impossible to grow the silicon monocrystal. Since the thin portion includes dislocations, the strength of the thin portion decreases. Consequently, an increase in the diameter of the neck portion does not necessarily lead to an increase in the strength of the same.

For these reasons, according to the conventional method, it is necessary to reduce the diameter of the thin portion to a diameter equal to or less than about 3 mm in order to eliminate dislocations from the silicon monocrystal. The thin portion does not has strength sufficient to pull a heavy silicon monocrystal. Therefore, in order to obtain a silicon monocrystal having a desired length, the silicon monocrystal that can be pulled is limited to a diameter of about 150 mm (6 inches). In order to pull a silicon monocrystal of about 200 mm (8 inches) diameter, a total weight of the silicon monocrystal must be pulled needs to be restricted. As a result, it is possible to pull only a silicon monocrystal shorter than a desired length, thereby resulting in a considerable reduction in the productivity and yield of the silicon monocrystal. If a silicon monocrystal having a large diameter is pulled to a desired length, an excessive stress will act on the neck portion. In consequence, there is a high risk of fracture of the neck portion due to plastic deformation during the course of pulling of the silicon monocrystal. This may result in the danger of serious accidents such as a drop of the silicon monocrystal.

To solve the above-described problem, mechanical supporting of a silicon monocrystal to be pulled has been conceived; however, the silicon monocrystal undergoes dislocations when it is supported. Further, a machine used in such a method is excessively expensive because of its complicated structure. Still further, the machine requires laborious operations and contaminates the silicon monocrystal with impurities from the machine. Thus, in actuality, such a machine has not yet been realized.

SUMMARY OF THE INVENTION

The present invention has been conceived in view of the foregoing drawbacks in the prior art. The object of the present invention is to provide a method of manufacturing a silicon monocrystal which allows an increase in the strength of a neck portion and considerably simple pulling of a heavy and long silicon monocrystal having a large diameter without need of a complicated apparatus.

Through several studies conducted to solve the previously-described problems, the following fact has been found. When such a conventional seed crystal 41 as shown in FIG. 5 is brought into contact with silicon melt 3, high-density dislocations arise in the seed crystal, as shown in FIG. 3A. If the diameter of a neck portion is increased at the time of a neck forming operation, the thus-occurred dislocations are shifted in a downward. In contrast, if there is used a seed crystal having a hollow portion which has an opening in its contact surface to be brought into contact with the silicon melt, the area of the seed crystal that is actually brought into contact with the silicon melt becomes smaller. Consequently, even if this seed crystal is brought into contact with the silicon melt 3, dislocations arising in the seed crystal 1 become considerably small, as shown in FIG. 3B. Further, dislocations do not arise in the center of the contact area. For this reason, even if the diameter of a thin portion is increased to more than 3 mm at the time of a neck forming operation, the dislocations can be prevented from being shifted downward at an early stage. Therefore, even if the diameter of the thin portion is considerably increased to, e.g., 5 to 30 mm, dislocations can be eliminated from the thin portion. Consequently, the strength of the neck portion can be increased. Eventually, there can be prevented plastic deformation of the neck portion caused when the silicon monocrystal is pulled. Accordingly, it is possible to pull a heavy and long silicon monocrystal having a large diameter without the risk of fracturing the neck portion, thereby resulting in considerable improvements in the productivity and yield of the silicon monocrystal.

To achieve the object, the present invention provides a method of manufacturing a silicon monocrystal using the Czochralski method in which a seed crystal is brought into contact with silicon melt and is then pulled such that after a neck portion is formed, a silicon monocrystal is grown below the neck portion. The seed crystal used in the method has a hollow portion which has an opening in the contact surface of the seed crystal to be brought into contact with the silicon melt.

Further, the present invention provides a method of manufacturing a silicon monocrystal using the Czochralski method in which a seed crystal is brought into contact with silicon melt and is then pulled such that after a neck portion is formed, a silicon monocrystal is grown below the neck portion. The seed crystal used in the method has a hollow portion which, upon being brought into contact with the silicon melt, will have an opening in the contact surface of the seed crystal to be brought into contact with the silicon melt.

Still further, the present invention provides a seed crystal for use with the Czochralski method which has a hollow portion which has an opening in the contact surface of the seed crystal to be brought into contact with silicon melt.

Moreover, the present invention provides a seed crystal for use with the Czochralski method which has a hollow portion which, upon being brought into contact with the silicon melt, will have an opening in the contact surface of the seed crystal to be brought into contact with the silicon melt.

In the present invention, dislocations can be eliminated from the thin portion even if the diameter of the thin portion is increased to as large as about 5 to 30 mm. Therefore, the strength of the neck portion can be increased. As a result, it is possible to pull a silicon monocrystal having a diameter equal to or greater than 8 inches, or a silicon monocrystal having a diameter equal to or greater than 12 inches which will be required in future, to a desired length without the risk of dropping of the silicon monocrystal to be pulled. Particularly, the productivity and yield of a silicon monocrystal having a large diameter can be increased.

Moreover, the present invention can be applied to a case where a silicon monocrystal having a diameter equal to or less than 6 inches is pulled. Use of the seed crystal of the present invention enables easy elimination of dislocations from the thin portion during the course of the neck forming operation, which in turn makes it possible to simplify and shorten the neck portion forming step.

BRIEF DESCRIPTION OF THE DRAWINGS

FIG. 1A is a perspective view of one example of a seed crystal used in the present invention;

FIG. 1B is a perspective view of another example of the seed crystal used in the present invention;

DESCRIPTION OF THE PREFERRED EMBODIMENT

Figure 2A:
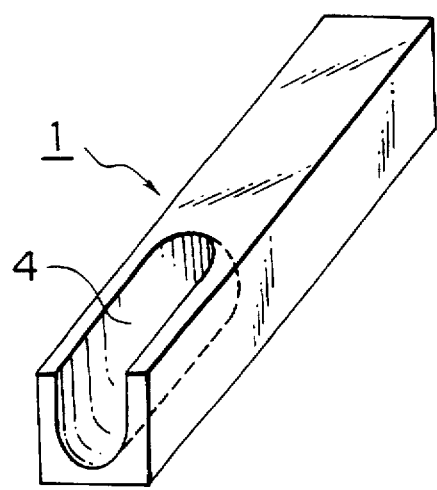
FIGS. 2A-2D are perspective views of still other examples of the seed crystal used in the present invention.
Figure 2B:
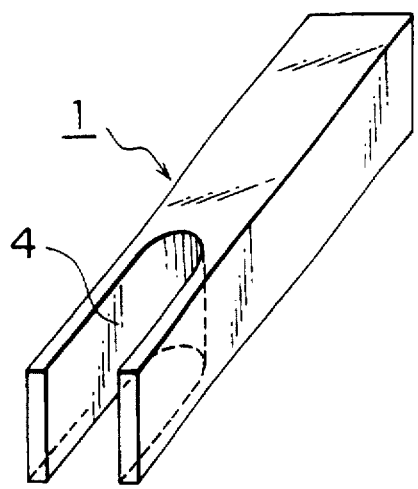
Figure 2C:
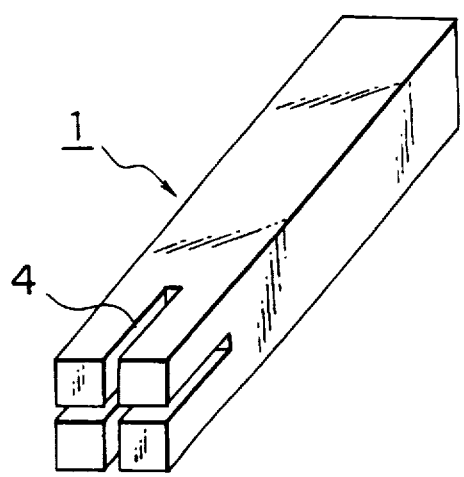

An embodiment of the present invention will be described with reference to the accompanying drawings.

A seed crystal used in a silicon monocrystal manufacturing method of the present invention usually has a prismatic or cylindrical shape. The peripheral shape of the contact surface of the seed crystal to be brought into contact with the silicon melt is square, hexagonal, octagonal, or circular. When a silicon monocrystal having a diameter equal to or greater than 8 inches is pulled and the contact surface of a seed crystal has a square peripheral shape, the dimensions of the seed crystal are determined such that the length of each side of the contact surface of the seed crystal becomes 10-30 mm. Alternatively, When a silicon monocrystal having a diameter equal to or greater than 8 inches is pulled and the contact surface of a seed crystal has a circular peripheral shape, the dimensions of the seed crystal are determined such that the diameter of the contact surface of the seed crystal becomes 10-30 mm. If the length of each side or diameter is less than 10 mm, the strength of the seed crystal is too low to pull the silicon monocrystal having a large diameter. In contrast, if the length of each side or diameter is more than 30 mm, the seed crystal becomes undesirably expensive. For these reasons, in a case where a heavy silicon monocrystal is pulled, a prismatic seed crystal whose contact surface has a side of 15-30 mm or a cylindrical seed crystal whose contact surface has a diameter of 15-30 mm is used in order to increase the strength of the seed crystal.

According to the silicon monocrystal manufacturing method of the present invention, there is used a seed crystal which has a hollow portion whose opening is formed in the contact surface of the seed crystal to be brought into contact with the silicon melt or a seed crystal which has a hollow portion whose opening will be formed in the contact surface of the seed crystal to be brought into contact with the silicon melt when the seed crystal is brought into contact with the silicon melt. The opening and the cross section of a hollow portion perpendicular to the longitudinal axis of the seed crystal may be of any shape. For example, the shape of the contact surface and the crosssectional shape of the hollow portion may have a square, hexagonal, octagonal, or circular shape. The hollow portion starts from the opening formed in the surface of the seed crystal to be brought into contact with the silicon melt and extends to an arbitrary length in the longitudinal direction of the seed crystal. The hollow portion may completely pass through the seed crystal. Alternatively, the seed crystal may has a structure such that no opening is initially formed in the contact surface to be brought into contact with the silicon melt, but an opening is formed in the contact surface when the contact surface contacts the silicon melt. In this case as well, the hollow portion may or may not penetrate through the seed crystal.

Preferably, with the present invention there is used a seed crystal having an opening that accounts for 5% to 95% of the area of the contact surface to be brought into contact with the silicon melt, or a seed crystal having a hollow whose cross section perpendicular to the longitudinal axis of the seed crystal accounting for 5% to 95% of the area of the contact surface to be brought into contact with the silicon melt. If the area is less than 5%, it becomes difficult to eliminate dislocations by a neck forming operation in a case where the diameter of the neck is greater than 3 mm. In contrast, if the area is more than 95%, there is a high risk of fracturing the neck portion during the course of pulling of the silicon monocrystal. Therefore, the opening area of 10% to 90% is particularly preferable in the present invention.

FIGS. 1A and 1B show examples of a seed crystal used in the present invention. Seed crystals 1 shown in FIGS. 1A and 1B are representative examples of the seed crystal used in the present invention. They are prismatic, and the peripheral shape of the contact surface of each of the seed crystals to be brought into contact with the silicon melt is square. Further, an opening 2 has a circular shape. Of these seed crystals, the seed crystal 1 shown in FIG. 1A has a hollow portion 4 completely passing through the seed crystal in its longitudinal direction. In contrast, the hollow portion 4 of the seed crystal 1 shown in FIG. 1B does not pass through the seed crystal.

In addition to the seed crystals shown in FIGS. 1A and 1B, seed crystals shown in FIGS. 2A to 2D are also used in the present invention. In this way, the concept "hollow" used herein is not limited to the hollow portions 4 shown in FIGS. 1A and 1B but also includes the hollow portions 4 shown in FIGS. 2A to 2D.

Figure 2D:
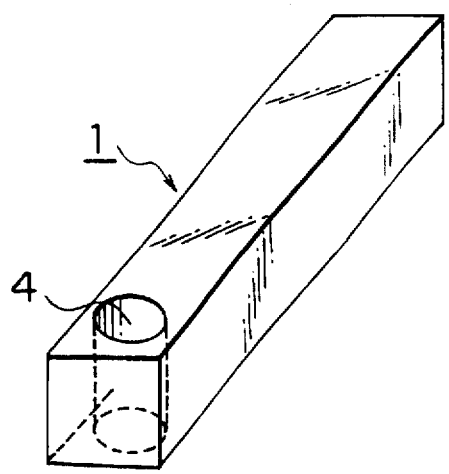
Figures 3A, 3B:
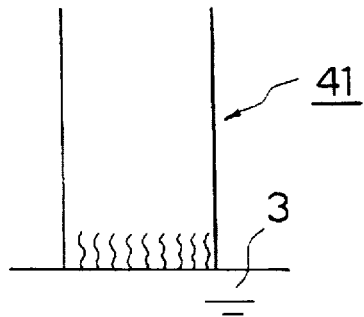
FIG. 3A is an illustrative representation showing dislocations which occur when a conventional seed crystal is brought into contact with silicon melt.
FIG. 3B is an illustrative representation showing dislocations which occur when a seed crystal of the present invention is brought into contact with silicon melt.

The seed crystal 1 shown in FIG. 2D is one example of a seed crystal having a hollow portion 4 whose opening is formed in the contact surface upon contact with the silicon melt. When the tip end of the seed crystal 1 shown in FIG. 2D is immersed in the silicon melt, the immersed area of the tip end is melted. As a result, the seed crystal becomes equal to the seed crystal shown in FIG. 2B.

Figures 4A, 4B, 4C:
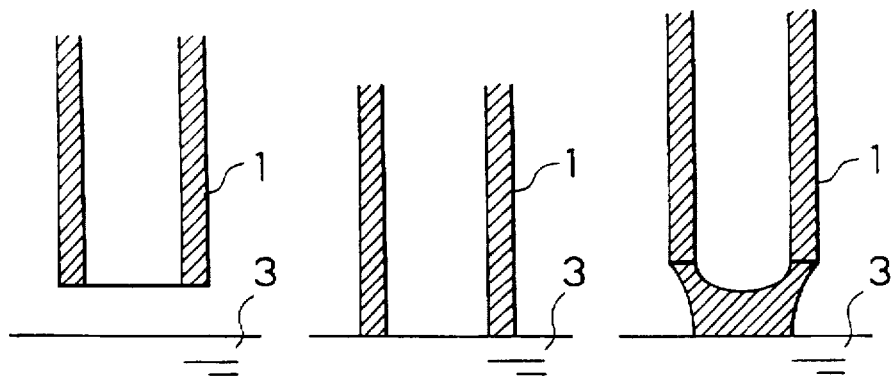
FIGS. 4A-4C are partial cross-sectional views showing variations in the relationship between a seed crystal and silicon melt when a neck forming operation is carried out using the seed crystal of the present invention.

FIGS. 4A to 4C are partial cross-sectional views showing variations in the relationship between the seed crystal 1 and the silicon melt 3 when a neck forming operation is carried out using the seed crystal of the present invention. In a case where a seed crystal having an opening formed in the contact surface to be brought into contact with silicon melt is used as the seed crystal, the seed crystal is caused to approach the silicon melt within a quartz crucible. Then, the seed crystal is immersed into the silicon melt (FIG. 4B) and is pulled after having been sufficiently adapted to the silicon melt. Then, a neck forming operation is carried out (FIG. 4C), so that a tapered portion and a thin portion are formed, in this sequence. In the case where a seed crystal whose opening is formed in the contact surface upon contact with the silicon melt is used as the seed crystal, the seed crystal becomes equivalent to the seed crystal shown in FIG. 4B when the opening in formed in the contact surface. Subsequently, a neck forming operation is carried out (FIG. 4C), so that a tapered portion and a thin portion are formed, in this sequence.

The neck portion is formed through gradual reduction of the diameter of the silicon crystal to be grown from the surface of the seed crystal in contact with the silicon melt. Subsequently, the thin portion is formed. At this time, dislocations can be eliminated even if the diameter of the thin portion (or the reduced diameter) is set to less than or more than 3 mm. The diameter of the thin portion is usually set to 2.5 to 3.0 mm.

EXAMPLES

Figure 5:
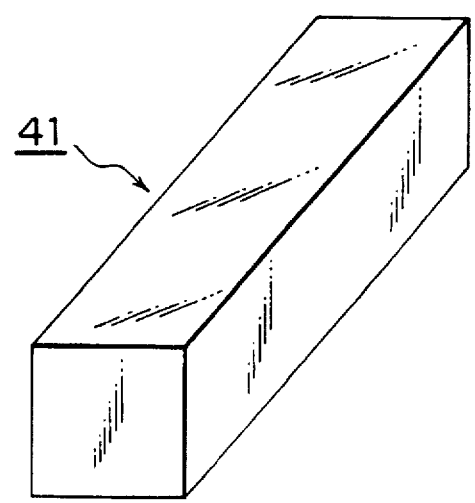
FIG. 5 is a perspective view of one example of a conventional seed crystal.

The silicon monocrystal was pulled using the seed crystal of the present invention (Example 1) and conventional seed crystals (Comparative Examples 1 and 2) in operation for pulling a silicon monocrystal according to the Czochralski method. After the neck forming operation, a check was made to see whether or not dislocations were eliminated when the diameter of the silicon monocrystal had been increased. The seed crystal of the present invention used in Example 1 has a prismatic shape as shown in FIG. 1. Further, the peripheral shape of the contact surface of the seed crystal to be brought into contact with the silicon melt was square. The length of the side of the square was set to 12 mm. Further, the seed crystal was hollow, and the shape of the contact surface section was circular. The ratio of the area of the opening to the area of the contact surface was set to 50%. In contrast, the conventional seed crystals used in Comparative Examples 1 and 2 had a prismatic peripheral shape as shown in FIG. 5. The peripheral shape of the contact surface of each of the seed crystals to be brought into contact with the silicon melt was square. The length of one side of the surface was set to 12 mm, and the seed crystals were not hollow.

Results of the test are shown in table 1.

TABLE 1

|  | Diameter of neck portion (mm φ) | Eliminated ratio of dislocations (%) |
| --- | --- | --- |
| Example 1 | 5–8 | 94 |
| Comparative Example 1 | not greater than about 3 | 98 |
| Comparative Example 2 | 5–8 | 5 |

As shown in table 1, in the case of comparative example 1, nearly 100% of dislocations were eliminated when the diameter of the thin portion was set to a diameter equal to or less than 3 mm. However, the diameter of the thin portion was as small as 3 mm, the thin portion could not withstand the pulling of a heavy silicon monocrystal. In the case of Comparative Example 2, the diameter of the thin portion was set to 5–8 mm, and dislocations were not substantially eliminated from the silicon monocrystal.

By contrast, the neck forming operation was carried out on a seed crystal of Example 1, with the diameter of the thin portion set to 5 to 8 mm. However, a sufficiently high rate of elimination of dislocations as high as 94% was achieved. When the seed crystal of the present invention was used, substantially no dislocations occurred when the seed crystal was brought into contact with the silicon melt even if the diameter of the thin portion was set to as large as 5 to 8 mm. Further, shift of resultingly-formed dislocations downward disappeared at an early stage. It was confirmed that dislocations were eliminated from the thin portion.

The present invention can be applied to the Magnetic Field Applied Czochralski Crystal Growth (MCZ) method in which a magnetic field is applied to a silicon monocrystal when it is pulled, in addition to the ordinary Czochralski method. The term "Czochralski Method" used herein implies the MCZ method as well as the ordinary Czochralski method.

The present invention is not limited to the above-described embodiments. The above-described embodiments are mere examples, and those having the substantially same structure as that described in the appended claims and providing the similar action and effects are included in the scope of the present invention.

What is claimed is:

1. A method of manufacturing a silicon monocrystal using the Czochralski method, said method comprising the steps of:
   a) bringing a seed crystal into contact with a silicon melt;
   b) forming a neck portion; and
   c) growing a silicon monocrystal below the neck portion, wherein said seed crystal has a hollow portion which has an opening in a contact surface of the seed crystal which is brought into contact with the silicon melt.

2. A method of manufacturing a silicon monocrystal according to claim 1, wherein a ratio of an area of the opening to an area of the contact surface of the seed crystal is in the range of 5–95%.

3. A method of manufacturing a silicon monocrystal according to claim 2, wherein the neck portion includes a reduced diameter portion having a diameter in the range of 2.5–30 mm.

4. A method of manufacturing a silicon monocrystal according to claim 2, wherein the neck portion includes a reduced diameter portion having a diameter in the range of 5–30 mm.

5. A method of manufacturing a silicon monocrystal according to claim 1, wherein the neck portion includes a reduced diameter portion having a diameter in the range of 2.5–30 mm.

6. A method of manufacturing a silicon monocrystal according to claim 1, wherein the neck portion includes a reduced diameter portion having a diameter in the range of 5–30 mm.

7. A method of manufacturing a silicon monocrystal using the Czochralski method, said method comprising the steps of:

a) bringing a seed crystal into contact with a silicon melt;
   b) forming a neck portion; and
   c) growing a silicon monocrystal below the neck portion, wherein said seed crystal has a hollow portion which has an opening in a contact surface of the seed crystal when the contact surface is brought into contact with the silicon melt.

8. A method of manufacturing a silicon monocrystal according to claim 7, wherein a ratio of a maximum cross-sectional area of the hollow portion in a direction perpendicular to a longitudinal axis of the seed crystal to an area of the contact surface of the seed crystal is in the range of 5–95%.

9. A method of manufacturing a silicon monocrystal according to claim 8, wherein the neck portion includes a reduced diameter portion having a diameter in the range of 2.5–30 mm.

10. A method of manufacturing a silicon monocrystal according to claim 8, wherein the neck portion includes a reduced diameter portion having a diameter in the range of 5–30 mm.

11. A method of manufacturing a silicon monocrystal according to claim 7, wherein the neck portion includes a reduced diameter portion having a diameter in the range of 2.5–30 mm.

12. A method of manufacturing a silicon monocrystal according to claim 7, wherein the neck portion includes a reduced diameter portion having a diameter in the range of 5–30 mm.

\* \* \* \* \*